United States Patent
Grede et al.

(10) Patent No.: US 10,312,064 B2
(45) Date of Patent: *Jun. 4, 2019

(54) EXTINGUISHING ARCS IN A PLASMA CHAMBER

(71) Applicant: TRUMPF Huettinger GmbH + Co. KG, Freiburg (DE)

(72) Inventors: Andre Grede, Bern (CH); Daniel Krausse, Mountain View, CA (US); Anton Labanc, Ehrenkirchen (DE); Christan Thome, Freiburg (DE); Alberto Pena Vidal, Freiburg (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/010,860

(22) Filed: Jun. 18, 2018

(65) Prior Publication Data

US 2018/0301323 A1    Oct. 18, 2018

Related U.S. Application Data

(63) Continuation of application No. 14/742,960, filed on Jun. 18, 2015, now Pat. No. 10,002,749, which is a
(Continued)

(30) Foreign Application Priority Data

Dec. 18, 2012 (DE) .................. 10 2012 223 659
Dec. 18, 2012 (DE) .................. 10 2012 223 660

(51) Int. Cl.
*H01J 37/32* (2006.01)

(52) U.S. Cl.
CPC .. *H01J 37/32944* (2013.01); *H01J 37/32064* (2013.01); *H01J 37/3299* (2013.01)

(58) Field of Classification Search
None
See application file for complete search history.

(56) References Cited

U.S. PATENT DOCUMENTS 3,156,622 A     11/1964  Hill et al.
4,003,003 A *   1/1977   Heaberlin ............... G10H 7/04
                                                     327/107
(Continued)

FOREIGN PATENT DOCUMENTS

CN     101076425     11/2007
DE       9210382     11/1992
(Continued)

OTHER PUBLICATIONS

Paramount Control Technology brochure, May 9, 2012, 5 pages.
Office Action in Japanese Application No. 2015-548209, dated Nov. 20, 2017, 7 pages (with English translation).

*Primary Examiner* — Dion Ferguson
*Assistant Examiner* — Srinivas Sathiraju
(74) *Attorney, Agent, or Firm* — Fish & Richardson P.C.

(57) ABSTRACT

A power supply system includes a digital-to-analogue converter (DAC) configured to generate an analogue signal and an amplifier path on which the analogue signal is amplified to generate a high-frequency power signal to be provided to a plasma chamber for supplying a plasma process with high-frequency power. The DAC is configured to be connected to an arc detection device that is configured to monitor the plasma chamber for arcs and be controlled by the arc detection device to modify the analogue signal in response to detecting an occurrence of an arc.

20 Claims, 3 Drawing Sheets

Related U.S. Application Data continuation of application No. PCT/DE2013/100430, filed on Dec. 18, 2013.

(56) References Cited

U.S. PATENT DOCUMENTS

| | | | |
|---|---|---|---|
| 4,053,848 A | 10/1977 | Kleische | |
| 4,700,315 A | 10/1987 | Blackburn et al. | |
| 5,477,188 A | 12/1995 | Chawla et al. | |
| 5,565,737 A | 10/1996 | Keane | |
| 5,729,145 A | 3/1998 | Blades | |
| 5,844,369 A | 12/1998 | Yoshizako et al. | |
| 5,939,886 A | 8/1999 | Turner et al. | |
| 5,982,099 A | 11/1999 | Barnes et al. | |
| 6,246,279 B1 | 6/2001 | Komuro | |
| 6,304,475 B1 | 10/2001 | Iwata et al. | |
| 6,316,756 B1 | 11/2001 | Thompson et al. | |
| 6,322,961 B1 | 11/2001 | Lam et al. | |
| 6,332,961 B1 | 12/2001 | Johnson et al. | |
| 6,384,540 B1 | 5/2002 | Porter et al. | |
| 6,522,121 B2 | 2/2003 | Coumou | |
| 6,703,080 B2 | 3/2004 | Reyzelman et al. | |
| 6,707,255 B2 | 3/2004 | Coumou et al. | |
| 6,765,469 B2 | 7/2004 | Sortor | |
| 6,778,921 B2 | 8/2004 | Keane et al. | |
| 6,791,274 B1 | 9/2004 | Hauer et al. | |
| 6,819,052 B2 | 11/2004 | Kitamura et al. | |
| 6,943,317 B1 | 9/2005 | Iilic et al. | |
| 7,115,185 B1 | 10/2006 | Gonzalez et al. | |
| 7,221,102 B2 | 5/2007 | Kalani et al. | |
| 7,304,438 B2 | 12/2007 | Kishinevsky | |
| 7,305,311 B2 | 12/2007 | van Zyl | |
| 7,477,711 B2 | 1/2009 | Kalvaitis et al. | |
| 7,489,145 B2 | 2/2009 | Maloba et al. | |
| 7,503,996 B2 | 3/2009 | Chen et al. | |
| 7,506,014 B2 | 3/2009 | Drummond | |
| 7,567,037 B2 | 7/2009 | Setsuhara et al. | |
| 7,702,702 B2 | 4/2010 | Tanaka et al. | |
| 7,767,053 B2 | 8/2010 | Takeda et al. | |
| 7,791,912 B2 | 9/2010 | Walde | |
| 7,822,565 B2 | 10/2010 | Brouk et al. | |
| 7,940,008 B2 | 5/2011 | Mattaboni et al. | |
| 7,970,562 B2 | 6/2011 | van Zyl | |
| 7,981,306 B2 | 7/2011 | Blattner et al. | |
| 8,842,704 B2 * | 9/2014 | Schmelzer | H01S 3/09702 372/28 |
| 8,890,537 B2 * | 11/2014 | Valcore, Jr. | H01J 37/32082 324/536 |
| 9,060,411 B2 * | 6/2015 | Biloiu | H05H 1/46 |
| 9,070,537 B2 * | 6/2015 | Yuzurihara | H01J 37/32082 |
| 9,129,779 B2 * | 9/2015 | Booth | H01J 37/32935 |
| 9,276,456 B2 | 3/2016 | Grede et al. | |
| 9,484,189 B2 * | 11/2016 | Winterhalter | H01J 37/32431 |
| 2002/0117489 A1 | 8/2002 | Arndt | |
| 2003/0178943 A1 | 9/2003 | Espiau et al. | |
| 2003/0205460 A1 * | 11/2003 | Buda | H01J 37/32935 204/192.13 |
| 2004/0182697 A1 * | 9/2004 | Buda | H01J 37/32935 204/298.08 |
| 2005/0237035 A1 * | 10/2005 | Reilly | G05F 1/66 323/208 |
| 2006/0049831 A1 | 3/2006 | Anwar et al. | |
| 2006/0252283 A1 * | 11/2006 | Takeda | H01J 37/32082 438/798 |
| 2007/0044715 A1 | 3/2007 | Blattner et al. | |
| 2007/0107844 A1 | 5/2007 | Bullock et al. | |
| 2007/0150819 A1 | 6/2007 | Goodman et al. | |
| 2008/0021664 A1 * | 1/2008 | Krauss | G01R 19/0061 702/65 |
| 2008/0105538 A1 | 5/2008 | Winterhalter et al. | |
| 2008/0122369 A1 | 5/2008 | Nitschke | |
| 2008/0133154 A1 * | 6/2008 | Krauss | C23C 14/54 702/58 |
| 2008/0237031 A1 | 10/2008 | Sato | |
| 2008/0296276 A1 * | 12/2008 | Schartner | B23K 9/1031 219/130.31 |
| 2009/0202741 A1 | 8/2009 | Stimson et al. | |
| 2009/0308734 A1 * | 12/2009 | Krauss | H01J 37/32935 204/192.13 |
| 2010/0123502 A1 | 5/2010 | Bhutta et al. | |
| 2010/0141221 A1 * | 6/2010 | Ilic | H01J 37/32935 323/234 |
| 2010/0187998 A1 * | 7/2010 | Yuzurihara | H01J 37/32009 315/111.21 |
| 2010/0276273 A1 | 11/2010 | Heckman et al. | |
| 2010/0327749 A1 * | 12/2010 | Nitschke | H01J 37/32935 315/111.21 |
| 2011/0121735 A1 * | 5/2011 | Penny | A61B 18/042 315/111.21 |
| 2011/0241781 A1 | 10/2011 | Owen et al. | |
| 2013/0038226 A1 * | 2/2013 | Labanc | H03H 7/48 315/173 |
| 2013/0134890 A1 * | 5/2013 | Richter | H01J 37/32018 315/200 R |
| 2015/0287576 A1 | 10/2015 | Grede et al. | |
| 2015/0288274 A1 | 10/2015 | Grede et al. | |

FOREIGN PATENT DOCUMENTS

| | | |
|---|---|---|
| DE | 102012223657 | 3/2014 |
| EP | 0287661 | 10/1988 |
| JP | 62-176442 | 8/1987 |
| JP | 04-312086 | 11/1992 |
| JP | H06-119997 | 4/1994 |
| JP | H06-300813 | 10/1994 |
| JP | 08-167500 | 6/1996 |
| JP | 2000138585 | 5/2000 |
| JP | 2000195698 | 7/2000 |
| JP | 20001036364 | 2/2001 |
| JP | 2004-154562 | 6/2004 |
| JP | 2005-116187 | 4/2005 |
| JP | 2005-312587 | 11/2005 |
| JP | 2006-140440 | 6/2006 |
| JP | 2006160440 | 6/2006 |
| JP | 2007-053088 A | 3/2007 |
| JP | 2007-110019 | 4/2007 |
| JP | 0 2007149597 | 6/2007 |
| JP | 2007-169730 | 7/2007 |
| JP | 2007-273935 | 10/2007 |
| JP | 4071077 | 4/2008 |
| JP | 2008-541404 | 11/2008 |
| JP | 2009290678 | 12/2009 |
| JP | 4580560 | 11/2010 |
| JP | 2011-014608 | 1/2011 |
| JP | 2011-527379 | 10/2011 |
| KR | 20080048310 | 6/2008 |
| WO | WO 1995/35597 | 12/1995 |
| WO | WO 2005/078750 | 8/2005 |
| WO | WO 2008061784 | 5/2008 |

* cited by examiner

EXTINGUISHING ARCS IN A PLASMA CHAMBER

CROSS-REFERENCE TO RELATED APPLICATIONS

This application is a continuation of and claims priority under 35 U.S.C. § 120 to U.S. application Ser. No. 14/742,960, filed on Jun. 18, 2015, which is a continuation of PCT Application No. PCT/DE2013/100430 filed on Dec. 18, 2013, which claimed priority to German Application No. DE 10 2012 223 659.7, filed on Dec. 18, 2012 and German Application No. DE 10 2012 223 660.0, filed on Dec. 18, 2012. The contents of all these priority applications are hereby incorporated by reference in their entirety.

TECHNICAL FIELD

The invention relates to methods, devices, and system for extinguishing arcs in a plasma chamber of a plasma system.

BACKGROUND

Plasma represents a specific aggregate condition produced from a gas. Every gas in principle comprises atoms and/or molecules. In a plasma the main part of the gas is ionized. This means that a supply of energy will split the atoms or molecules into positive and negative charge carriers, namely into ions and electrons. Plasma is suitable for processing work pieces, as the electrically charged particles are chemically reactive to a high degree and can also be influenced by electric fields. The charged particles can be accelerated onto an object by an electric field, where they can separate individual atoms from the same upon impact. The separated atoms can be transported away by a gas flow (etching) or stored on other objects as a coating (production of thin films). Such processes are applied by a plasma in particular when extremely thin layers, in particular within a range of a few atom layers, are to be processed. Typical applications are semi-conductor technologies (coating, etching, etc.), flat screen monitors (similar to semi-conductor technology), solar cells (similar to semi-conductor technology), architectural glass coatings (heat protection, glare protection, etc.) storage media (CD, DVD, hard drives), decorative layers (colored glass, etc.), and tool hardening. These applications place high requirements on accuracy and process stability. Plasma can also serve for the excitation of lasers.

In order to generate a plasma from a gas, the gas needs to be supplied with energy. This can be realized in different ways, for example by light, heat, and/or electric energy. A plasma for processing work pieces is typically ignited in a plasma chamber and maintained there. For this, an inert gas, for example argon, is normally introduced into the plasma chamber at low pressure. The gas is then exposed to an electric field via electrodes and/or antennae. Plasma is created or ignited when several conditions are fulfilled. A small number of free charge carriers must first be present, whereby free electrons that are usually present to a very small extent are being used. The free charge carriers are accelerated so strongly by the electric field that they separate further electrons upon impact with atoms or molecules of the inert gas, which creates further positively charged ions and further negatively charged electrons. The additional free charge carriers are in turn accelerated and create further ions and electrons upon impact. This will initiate an avalanche effect. The continuous production of ions and electrons is counteracted by the discharges during the collision of these particles with the wall of the plasma chamber or other objects as well as by natural recombination, i.e., electrons are attracted by ions and recombine to form electrically neutral atoms or molecules. Once a plasma has been ignited, it must therefore be continuously supplied with energy in order to maintain the same.

This energy supply can be realized via a direct current (DC) or an alternating current (AC) power supply. The frequencies that occur during plasma excitation with an AC power supply can reach gigahertz ranges.

Short-term or longer-term flashovers, so-called arcs, can occur in the plasma, which are undesirable. When such an arc is detected it must be ensured that the arc is extinguished as quickly as possible, i.e., that it cannot develop fully.

It is known to switch off the energy supply completely upon detection of an arc in order to enforce the extinguishing of the arc. One disadvantage of this approach is that the plasma process is interrupted and that it takes a certain time before the plasma can be reignited after extinguishing the arc and plasma processing can be continued. It is also often not possible to ascertain for definite whether an arc has been extinguished. Appropriately long periods are therefore envisaged, after which an arc will normally be extinguished. This will however lead to longer interruptions of the plasma processing process.

SUMMARY

One aspect of the invention features an arc extinguishing method for extinguishing arcs in a plasma chamber of a plasma system, comprising providing a plasma operating power during a plasma operation to the plasma chamber for generating plasma in the plasma chamber and carrying out a plasma-processing process using the generated plasma, by generating an analogue signal by a digital-to-analogue converter (DAC) and amplifying the generated analogue signal on an amplifier path; monitoring, by an arc detection device, the plasma system for arcs; and in response to detecting an occurrence of an arc, controlling the DAC by the arc detection device such that the generated analogue signal by the DAC is modified.

In some implementations, the arc extinguishing method comprises producing an arc extinguishing power that is smaller than the plasma operating power for supplying the plasma chamber with the arc extinguishing power during an arc extinguishing operation. The plasma operating power and the arc extinguishing power can be at least partially produced in that the DAC is controlled in dependence on monitoring the plasma system for the occurrence of an arc, and in that the analogue output signal of the DAC in amplified on a subsequent amplifier path, at least into a part of the plasma power or the arc extinguishing power. With various implementations of this method, a faster and more reliable extinguishing of arcs can be realized without affecting a plasma processing process unnecessarily. Such an arc extinguishing method can be many times faster than conventional arc extinguishing methods. It is also much more flexible in its adjustment. The arc extinguishing method realizes effective protection of a power converter when flashovers (arcs) occur in a plasma chamber. Power can also be switched on again quickly after detecting arcs, so the effects on the substrate of the plasma process can be reduced.

It has until now been the norm to blank out the power supply during flashovers as soon as an arc is detected during a plasma application. This is done with the aim of extinguishing the flashover in the chamber and protecting substrates present in the chamber on the one hand, and of protecting the active components in the power converter on the other hand. The use of robust semi-conductors and correspondingly fast control means that power is reduced according to the invention only until the flashover or arc is completely extinguished. The plasma operating power can be reduced to the arc extinguishing power solely until the flashover is completely extinguished. Power can then immediately be restored to 100%, i.e., the full plasma operating power can be supplied to the plasma chamber. This has the advantage that complete plasma ignition can be restored within the chamber more quickly compared with previous known methods. The effects of the flashover, and thus the blanking out of power, are therefore clearly reduced.

Depending on plasma system monitoring, one or more further DACs can be controlled to detect the occurrence of an arc, and the relevant analogue output signal of the DAC can be amplified on a subsequent amplifier path into a part of the plasma power or the arc extinguishing power. Several amplifier paths can be operated in parallel in this way. This means that no excessive power needs to be produced on individual amplifier paths, which has a favorable effect on costs for the components used for an amplifier path.

Another aspect of the invention features an arc extinguishing method for extinguishing arcs in a plasma chamber of a plasma system, comprising the method steps:

a. producing power during a plasma operation for producing plasma in the plasma chamber and for carrying out a plasma-processing process using the produced plasma in that an analogue signal is generated with a digital analogue converter, supplied to an amplifier path, and amplified in the amplifier path;

b. monitoring the plasma system with regard to the presence of an arc through an arc detector; and c. if an arc is detected in step b, controlling the digital analogue converter through the arc detector such that an analogue output signal of the digital analogue converter is changed.

In particular an arc detection signal, with which the digital analogue converter (DAC) can be controlled directly, can be generated through arc detection. This means that no time is lost on, for example, routing the arc detection signal via a logic circuit, where the arc detection signal is processed. The arc detection signal is therefore preferably supplied directly to the DAC, without intermediate logic. This enables a very fast reaction, for example a switch-off, when flashovers are detected, in that the analogue signal supplied to the amplifier path is changed. The plasma supply system is protected in this way. The use of time-intensive logic between sensors and a power controller, which would result in a long reaction time and therefore a slow reaction to an arc, can thus be avoided.

Such an arc extinguishing method can be many times faster than conventional arc extinguishing methods. The arc extinguishing method realizes effective protection of a power converter when flashovers (arcs) occur in a plasma chamber.

One or more further DACs can be controlled upon detection of an arc through the arc detection. As a reaction to the detection of an arc, power can for example be reduced on so far that the flashover is completely extinguished. Once the arc is extinguished, power can be reinstated relatively quickly. If several DACs are provided, several amplifier paths operated in parallel can also be provided. This means that no excessive power needs to be produced on individual amplifier paths, which has a favorable effect on costs for the components used for an amplifier path. The control of several DACs allocated to several amplifier paths can also enable fast reaction to the occurrence of an arc.

The analogue output signals of at least two DACs on the relevant subsequent amplifier paths can be amplified differently, or different cycle times can be realized for the amplifier paths. The use of different amplifier paths can therefore enable the setting of a total power that results from the coupling or combination of the output powers of individual amplifier paths. In this way the power supplied to the plasma chamber can be set much more flexibly than with the use of just one amplifier path or when using amplifier paths generating exactly the same output power.

A reference signal input of the DAC can be controlled by the arc detection. An input voltage or input current in particular can be changed at the reference signal input. The reference signal can be used for influencing the output signal of the DAC. In this way it is possible to influence the output signal of the DAC very quickly and therefore very quickly change the power supplied to the plasma chamber. The power supplied to the plasma chamber can in particular be reduced in order to extinguish an arc.

The analogue output signal of a DAC can in particular be set very quickly and reliably when the DAC is supplied with a series of digital values. The digital values can be stored in memory, in particular in a reference table (look-up-table) for this.

The analogue output signal of the associated DAC can be amplified by a constant amplification factor on at least one amplifier path. In this way the amplifiers used on that amplifier path can be designed to be particularly simple.

At least one DAC can be supplied with the same series of digital values irrespective of whether an arc is detected or not. The reaction to a detection of an arc thus does not follow the supplied series of digital values, but can be effected in some other way that may be faster than the change of the analogue output signal of the DAC due to a changed series of digital values under certain circumstances.

At least one DAC can be supplied with a different reference signal when an arc is detected than when no arc is detected. The reference signal can be used for influencing the output signal of the DAC. Controlling the DAC with the reference signal can lead to a clearly faster change to the DAC output signal than a change to the supplied series of digital values.

If at least one DAC is supplied with the same reference signal during plasma operation as it is during arc extinguishing operation, the change to the analogue output signal of the DAC can be realized in that a changed series of digital values is supplied.

It can be monitored whether the detected arc has been extinguished, and upon detection of the extinguishing of the arc an arc detection signal can no longer be supplied to the DAC. There will therefore be no predetermined time spent waiting until power can once again be supplied to the plasma chamber. Such a predetermined time can under certain circumstances be longer than the time that is actually required for extinguishing the arc. If, in contrast, it is monitored whether the arc has been extinguished, power can once again be supplied to the plasma chamber as soon as the arc has been extinguished. The interruption time of the plasma process can thus be kept to a minimum.

At least one analogue output signal of a DAC can be generated by a direct digital synthesis component (DDS component) comprising the DAC. With a DDS component it is possible to effect a particularly fast generation of an analogue output signal. The extinguishing of the arc, and therefore the minimizing of power supplied to the plasma chamber, can be realized in that a reference signal input of the DDS component is controlled, and in particular an input voltage at the reference signal input is changed, in particular increased. With such a control of the DDS component it is possible to very quickly change the analogue output signal, and therefore the power supplied to the plasma chamber.

Each DAC can be supplied with its own (individual) series of digital values. In this way the output signal of DAC generated can be individually set. Different amplifier paths in particular can be supplied with different analogue input signals. The total power supplied to a plasma chamber can therefore be set in a particularly flexible way.

The series of digital values can be read from memory, comprising a central logic assembly. Such memory can be so-called look-up-tables.

The series of digital values can be generated in that a signal data value stored in a signal data memory is multiplied with an amplitude data value stored in an amplitude data memory. The series of digital values can in particular be generated in that a series of signal data values stored in a signal data memory is read with the aid of a counter, the series of signal data values then supplied to a multiplier and multiplied by the multiplier with an amplitude data value read from an amplitude data memory. An analogue signal can include an analogue voltage. It is therefore possible to generate a digital signal comprising information regarding the signal form and the amplitude of the analogue signal to be produced in the DAC in a simple way. This has advantages, in particular when several analogue signals are generated in parallel, which are then combined with a combiner, so that the signals to be combined can be adapted to each other easily and quickly.

Amplifier paths controlled with an analogue signal generated in this way are particularly well suited for the parallel operation of several amplifier paths. Power produced in this way can be combined easily at the output of the amplifier paths. This results in a very fast and precisely adjustable total power of a power converter.

The arc detection can control an arc management circuit, which can in turn control the DAC or DACs, either directly or indirectly. The DAC can first be controlled with the arc detection signal generated upon arc detection in order to react very quickly to the arc detected. This fast arc detection by the arc management circuit can be supplemented in that further decisions regarding treatment of the arc are made.

The arc management circuit can influence the amplitude of the analogue signal in that the amplitude data value stored in the amplitude data memory is changed. Amplitude modulation can be carried out very quickly in this way. The output powers of several amplifier paths can also be changed very quickly, whilst the synchronization of amplifier paths with each other remains unaffected at the same time.

The arc management circuit can influence the amplitude of the analogue signal in that the signal data value stored in the signal data memory is changed. Amplitude modulation can also be carried out quickly in this way. The output powers of several amplifier paths can also be changed very quickly, and a non-linear amplification and phase displacement can be taken into consideration for different amplitudes of the analogue signal of the amplifiers.

Monitoring of the plasma system can include the occurrence of an arc in that a signal in relationship to a power Pi supplied to the plasma and/or a power Pr reflected by the plasma and/or a current flowing into the plasma and/or a voltage applied to the plasma is recorded, and an arc detection signal is generated from said signal by the arc detection. In particular the recorded signal can be converted into digitalized values by an analogue-to-digital converter (ADC), whilst these digitalized values can be supplied to a logic circuit, in particular a programmable logic component, whereby the programmable logic component evaluates these digitalized values and generates the arc detection signal. With such an optimized and specialized logic the speed of arc detection can be increased substantially. In addition a single signal will suffice in this case to notify the existence of an arc, for example to switch off the plasma system. With the direct connection of the arc detection signal with the DAC, the arc can be recognized practically without delay. This in effect equals a real-time monitoring of plasma system signals and enables very rapid switch-off of the system when flashovers occur. The use of time-intensive logic between sensors and a system controller leads to a long reaction time, and therefore to a slow reaction, which is avoided according to the invention. By using a specific line for transmitting the arc detection signal a minimal delay can be realized.

Power can be generated in that high-frequency power, in particular with a frequency of $>1$ MHz, is generated and the DAC or DACs is/are controlled to generate a signal with this frequency.

The recorded signal can be sampled by the ADC with a frequency of $>1$ MHz, and the programmable logic component can be clocked with a clock signal at a frequency of $>1$ MHz. The same clock signal can be supplied to the ADC and the programmable logic component. In this way the fastest possible signal processing can be ensured.

The at least one amplifier path can be supplied with an analogue signal generated from a digital signal by a DAC. The analogue signal can be amplified into a high-frequency power signal on the amplifier path. The digital signal can in particular be generated in that a signal data value stored in a signal data memory is multiplied with an amplitude data value stored in an amplitude data memory. This can enable a very fast reaction to an arc detection.

The series of digital values can in particular be generated in that a series of signal data values stored in a signal data memory is read with the aid of a counter, the series of signal data values then supplied to a multiplier, and multiplied by the multiplier with an amplitude data value read from an amplitude data memory.

The at least two amplifier paths can be supplied with an analogue signal each, generated from a DAC from one digital signal each. The analogue signals can be amplified into a high-frequency power signal on one amplifier path each. The digital signals can be generated in that a signal data value stored in a signal data memory is multiplied with an amplitude data value stored in an amplitude data memory. This can enable a very fast and flexible reaction to an arc detection.

The amplitude data values stored in the amplitude data memory can be changed to switch from generating the plasma operating power to generating arc extinguishing power. In this way the amplifier path output power can be rapidly changed and the synchronization of amplifier paths with each other remains unaffected at the same time.

The multiplication of the amplitude data values stored in the amplitude data memories with the signal data values stored in the signal value memories can take place in a DDS component. This can reduce the number of components as well as costs.

Arc extinguishing power can be selected in such a way that the detected arc is extinguished. Whilst it has been usual until now to blank out power upon detection of a flashover and to then switch it back on in the assumption that the flashover has been extinguished, it is possible according to the invention to reduce power supplied to the plasma chamber from plasma operating power to arc extinguishing power. With a continuous supply of arc extinguishing power to the chamber it can be identified and ensured whether the flashover has definitely been extinguished. As soon as it is detected that the arc has definitely been extinguished, the arc extinguishing power can be increased to plasma operating power once more. Processes that ignite at a low process energy, in particular, can initially continue to be run on a low energy level (for example lower acceleration rate) thanks to the reduction in plasma process power. Once the extinguishing of the arc has been safely identified, process operation can continue with the original parameters. This will reduce the energy reflected by the plasma chamber and matching network to the power converter and therefore increases the working life of the power converter.

The analogue output signal of the associated DAC on at least one amplifier path can be amplified during plasma operation as well as during arc extinguishing operation with a constant amplifying factor. In this way the amplifiers used on that amplifier path can be designed particularly simply. It can further be envisaged that the same amplification factor is used during plasma operation and during arc extinguishing operation.

At least one DAC can be supplied with the same series of digital values during plasma operation and during arc extinguishing operation. The change from plasma operating power to arc extinguishing power is thus not realized by the series of digital values supplied, but can be effected in some other way, which may be faster than changing the analogue output signal of the DAC due to a changed series of digital values under certain circumstances.

With at least one DAC a different analogue output signal can be generated during plasma operation than during arc extinguishing operation. This means that arc extinguishing power can be set in a particularly easy way during arc extinguishing operation.

At least one DAC can be supplied with a different reference signal during plasma operation than during arc extinguishing operation. The reference signal can be used for influencing the output signal of the DAC. Controlling the DAC with the reference signal can result in a clearly faster change of the DAC output signal than a change of the series of digital values supplied.

If at least one DAC is supplied with the same reference signal during plasma operation as during arc extinguishing operation, the change of the analogue DAC output signal can be realized in that a changed series of digital values is supplied.

It can further be envisaged that all DACs are supplied with the same plasma operating reference signal during plasma operation. All DACs can also be supplied with the same arc extinguishing reference signal during arc extinguishing operation. The change from plasma operating power to arc extinguishing power can therefore be realized particular easily in that the DAC is supplied with a different reference signal.

It can be monitored whether the detected arc has been extinguished, and upon detection of the extinguishing of the arc plasma operating power can once again be generated and supplied to the plasma chamber. There is therefore no need to wait for a predetermined time before plasma operating power can once again be supplied to the plasma chamber. Such a predetermined time may under certain circumstances even be longer than the time actually required for extinguishing the arc. If it is instead monitored whether the arc has been extinguished, plasma operating power can once again be supplied to the plasma chamber as soon as the arc has been extinguished. In this way the interruption of the plasma process can be minimized.

Upon detection of an arc plasma operating power can be changed to arc extinguishing power, either in steps or gradually. Excessively large power changes in the plasma chamber can be avoided in this way.

It can be monitored after detecting an arc in particular whether the detected arc has been extinguished, and arc extinguishing power can be reduced in steps or gradually until it is detected that the arc has been extinguished. Arc extinguishing power can therefore be reduced even further, but only when the arc has not yet been extinguished. In this way it can be prevented that the arc extinguishing power is reduced too far.

Upon detection of an arc plasma operating power can be switched to an arc extinguishing power of >0 watt. In this way the power supply is not completely blanked out, but a certain amount of power will still be supplied to the plasma chamber, even during arc extinguishing operation.

The number or size of steps of the stepped transition or the gradient of the gradual transition can be adjustable. In this way the transition from plasma operating power to arc extinguishing power can be selected depending on the plasma process carried out.

At least one analogue output signal of a DAC can be generated by a Direct Digital Synthesis component (DDS component) comprising the DAC. A particularly fast generation of an analogue output signal can be realized with a DDS component. The transition from plasma operating power to arc extinguishing power can be realized in that a reference signal input of the DDS component is controlled, in particular an input voltage increased at the reference signal input. With such a control of the DDS component the analogue output signal, and therefore the power supplied to the plasma chamber, can be changed particularly rapidly.

Each DAC can be supplied with its own (individual) series of digital values. In this way the generated output signal of the DAC can be set individually. Different amplifier paths in particular can be supplied with different analogue input signals. In this way the total power supplied to a plasma chamber can be set particularly flexibly.

The series of digital values can be read from a data memory comprising a central logic assembly. The data memory can comprise so-called look-up-tables.

Another aspect of the invention features a power supply system with a power converter generating a high-frequency signal, which can be connected with a plasma chamber for supplying a plasma process with high-frequency power. The power converter comprises a first amplifier path, supplied with an analogue signal generated by a DAC, whereby the DAC is at least indirectly connected with an arc detection. This means that the arc detection can issue a direct signal to the DAC. Alternatively it is feasible that an arc detection is connected with the DAC via further components, for example a control component. A particularly fast reaction to the detection of an arc can be realized in that the arc detection is directly connected with the DAC, and therefore influences the output signal generated by the DAC directly.

The DAC can comprise a digital signal input and a reference signal input. A control circuit can also be envisaged for generating at least one input signal for the input of a DAC depending on an arc detection signal recorded by the arc detection. The arc detection can in particular change the reference signal supplied to the reference signal input. Even if the series of digital values supplied to the DAC remains the same, the output signal generated by the DAC can still be influenced. In this way a particularly fast reduction from plasma operating power to arc extinguishing power can be realized.

The power converter can comprise several amplifier paths, each of which is allocated a DAC that supplies the relevant amplifier path with an analogue signal. In this way a power signal can be generated on several amplifier paths in parallel. The same amplifier can be generated for the amplifier paths, or different power signals can be generated.

The at least one amplifier path can be supplied with an analogue signal generated from a digital signal by a DAC. A logic circuit unit for generating the digital signal supplied to the DAC can in particular be installed upstream from the DAC here. The logic circuit unit can in particular comprise one or more of the following units: a signal data memory, in which signal data values for generating an analogue signal form are stored, an amplitude data memory, in which amplitude data values for influencing the amplitudes of the analogue signals are stored, and a multiplier, for multiplying signal data values with amplitude data values. It is possible to react very quickly to an arc detection in this way.

The at least two amplifier paths can each be supplied with an analogue signal generated from a digital signal by the DAC. For this a logic circuit unit for generating the digital signal supplied to each DAC can in particular be installed upstream from the DAC here. The logic circuit unit can in particular comprise one or more of the following units for this: a signal data memory, in which signal data values for generating an analogue signal form are stored, an amplitude data memory, in which amplitude data values for influencing the amplitudes of the analogue signals are stored, and a multiplier, for multiplying signal data values with amplitude data values. It is possible to react very quickly to an arc detection in this way, whilst individual amplifier paths will continue to work synchronously. The units can be integrated into a DDS.

The arc detection can be connected with a logic circuit unit in such a way that it can influence the amplitude data memory. It is possible to react particularly quickly to an arc detection in this way, whilst individual amplifier paths will continue to work synchronously.

The units can be integrated into a DDS component. This can reduce the number of components as well as costs.

The amplifier paths can be connected with a coupler or a combiner for coupling the power generated on the amplifier paths to a total power. Relatively low power can be generated in parallel on several amplifier paths in this way, which is subsequently coupled via a combiner. Total power supplied at the combiner can thus be produced particularly flexibly and cost effectively.

The combiner can be designed without equalizing impedances for input signals of different strengths and/or phasing for coupling the power generated in the amplifier paths. This results in a particularly easy and cost effective construction of the combiner.

The amplifier paths can comprise laterally diffused metal oxide semiconductor (LDMOS) transistors. LDMOS transistors are characterized by an extremely high current load rating. They do however have the disadvantage that they can be operated only at relatively low voltages, which would not suffice the kind of power required for industrial plasma generation. The advantage of a power converter with several amplifier paths and a simple combiner is that only a low voltage with high current on the amplified transistor (in particular an LDMOS transistor) can be applied to each path, i.e., a signal with low impedance is generated. Several of such signals can be coupled by the combiner to form the total power required for the plasma process.

The control circuit can be designed as a Field Programmable Gate Array (FPGA), which can be connected with a DAC of the amplifier paths, or integrated in the same. A control circuit designed as an FPGA can work particularly quickly. The FPGA can be controlled by a digital signal processor (DSP). Particularly rapid signal processing and a correspondingly fast reaction to the detection of an arc in the plasma chamber also result from this.

Another aspect of the invention features a power supply system with a power converter that can be connected with a plasma chamber for supplying a plasma processor with power. The power converter comprises a first amplifier path that is supplied with an analogue signal generated by a DAC, whereby the DAC is connected with an arc detection. The DAC can in particular be connected straight, i.e., directly without interconnected logic, with the arc detection. This means that the arc detection can supply a signal to a DAC directly. This means that a particularly fast reaction to a detection of an arc is possible. The output signal generated by the DAC can therefore be influenced directly.

A signal line can be looped through a logic assembly from the arc detection to the DAC. The logic assembly can serve for controlling the DAC within an arc-free range. The "laying" of an additional line can be avoided if the signal line is looped through the logic assembly. A transmission of the arc detection signal via a signal line that is looped through a logic assembly can be understood as a direct connection of the arc detection with the DAC, as the arc detection signal is not processed and evaluated further in the logic assembly.

A measuring device into which the arc detection is integrated can be provided. The measuring device can be designed for recording current, voltage and/or power, in particular forward and return power, i.e., reflected power. The measuring device can in particular be equipped with embedded digitalization and processing of measured signals. Additional logic components can enable the generation of the arc detection directly therein.

The measuring device can comprise a directional coupler. A directional coupler can be designed to record power, in particular of forward and return power. The measuring device can comprise a power converter. The power converter can for example be designed as a Rogowsky coil. The Rogowsky coil can be of a pancake design.

The measuring device can comprise an ADC. The measuring device and the ADC can in particular be located on a circuit board. The measuring device can be of a planar construction. A filter can in particular be located between the ADC and the measuring device. The filter can also be located on the same circuit board as the ADC and the measuring device.

The measuring device can comprise a logic circuit for generating the arc detection signal. The logic circuit can be a programmable logic circuit (PLD). This has the advantage that the logic circuit can be changed, in particular programmed, by a user. The programmable logic circuits can for example be designed as a so-called FPGA (Field Programmable Gate Array) for this. This logic assembly can be located on the same circuit board as the measuring device and the ADC. ADC and logic circuit can in particular be realized as one component. Clocking can also be realized on this circuit board. Alternatively a clock cycle can be externally generated. Clocking can be realized synchronously with the frequency of the power signal. The frequency of the clock signal can be >1 MHz.

An arc management circuit that is connected with the arc detection and at least one DAC can be provided. The fact that the arc management circuit is connected with the arc detection means that the arc management circuit is notified when an arc is identified. If the arc detection can control the DAC directly and can bring about a power reduction in this way, the arc management circuit can carry out further data processing and in particular record whether an arc has been extinguished or not, and also control the DAC depending on this.

The DAC can comprise a digital signal input and a reference signal input, and the arc management circuit can generate at least one input signal for an input of the DAC dependent on the arc detection signal recorded by the arc detection. The arc management circuit can in particular change the reference signal supplied to the reference signal input. Even if the series of digital values supplied to the DAC remains the same, the output signal generated by the DAC can therefore be influenced in this way.

The power converter can comprise several amplifier paths each allocated with a DAC that supplies the relevant amplifier path with an analogue signal. A power signal can therefore be generated in parallel on several amplifier paths. The same power signal can be generated on all amplifier paths, or different power signals can be generated. The parallel arrangement of amplifier paths results in a particularly compact construction for high output power. Such a power converter can be particularly easy to adjust.

The amplifier paths can be connected with a combiner for combining the power generated on the amplifier paths into total power. Relatively simple combiners can be used for this, which are cheaper to produce, but have high requirements with regard to phasing, amplitudes and frequencies of the input signals. The power converter can be constructed in a particularly compact way as well as cost effectively in this way.

The combiner can be designed without equalizing impedances for input signals of different strengths and/or phasing for combining the power generated on the amplifier paths. Such a combiner is particularly energy saving and cost effective. Such a combiner can also be constructed in a very compact way with few components.

The amplifier paths can comprise LDMOS technology transistors. The LDMOS technology transistors are MOSFETs, mostly used within the GHz range to date. The use of these transistors in a range below 200 MHz has not been known so far. Whilst using the LDMOS technology transistors in amplifiers for generating power to be supplied to a plasma process it has surprisingly been found that these LDMOS technology transistors work far more reliably than comparable conventional MOSFETs. This may be due to a very much higher current load rating. Trials with several amplifier paths and at frequencies of 3.4 MHz, 13 MHz, 27 MHz, 40 MHz and 162 MHz in particular have shown that these transistor types are extremely reliable. A further advantage of these transistor types compared to conventional MOSFETs comprises the fact that identical transistors can be used for the said frequencies (3.4 MHz, 13 MHz, 27 MHz, 40 MHz and 162 MHz). This means that amplifiers and power supply systems to be used at frequencies covering several decades within a range from 1 MHz to 200 MHz can now be constructed with a very similar or even identical topology. These are frequencies that are often used in plasma processes and for gas laser excitation. The frequency can be set by simply changing the control of the DACs, the amplitude by changing the values on the digital memory or in the reference tables (look-up-tables). Conventional MOSFETs often have problems when operated at these frequencies during plasma processes when too much power supplied to the plasma process is reflected back. The power generation must therefore often be limited in order to ensure that the reflected power does not increase above a critical limit. In this way the plasma processes could not always be ignited safely or operated within the desires power range. Complex controllable impedance adjustment circuits and combiners were also envisaged to rectify these disadvantages. The use of LDMOS transistors is particularly advantageous if a substantial power reflection must be expected, as is for example the case with the supply of plasma processes. The advantage of LDMOS transistors in connection with the above mentioned combiners comprises the fact that much higher power reflections can be absorbed from the transistors. In this way the requirements regarding additional intermediate power supply systems and load switched impedance matching networks are reduced, and costs for components and control can be saved with such impedance matching networks.

The control circuit can be designed as an FPGA connected with a DAC of the amplifier paths, or can be integrated into the same. A control circuit designed as an FPGA can in particular work very fast. The FPDA can be controlled by a digital signal processor (DSP). This also results in very fast signal processing and a correspondingly fast reaction to the detection of an arc in the plasma chamber. The FPGA can include the arc management circuit.

The power converter can generate high-frequency power with a frequency of>1 MHz, and the analogue signal supplied to the amplifier path from the DAC can be a signal with this frequency.

Other advantages and advantageous embodiments of the subject-matter of the invention will be appreciated from the description, the claims and the drawings. The features mentioned above and those set out below may also be used individually per se or together in any combination. The embodiments shown and described are not intended to be understood to be a conclusive listing but are instead of exemplary character for describing the invention. The Figures of the drawings show the subject-matter according to the invention in a highly schematic manner and are not intended to be understood to be to scale.

DETAILED DESCRIPTION

Figure 1:
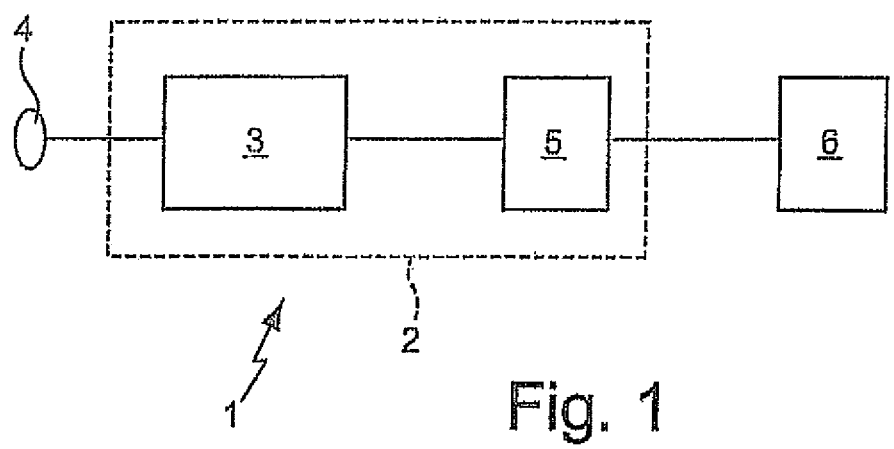
FIG. 1 is a schematic illustration of an example plasma system with an example power supply system.

FIG. 1 shows a plasma system 1, comprising a power supply system 2. The power supply system 2 in turn comprises a power converter 3 that can be connected with a voltage supply network 4. The power generated at the output of the power converter 3 is supplied to a plasma chamber 6 via an impedance matching network 5, where plasma is produced, with the aid of which plasma processing can be carried out in a plasma chamber 6. A work piece can in particular be etched, or a material layer applied to a substrate.

Figure 2:
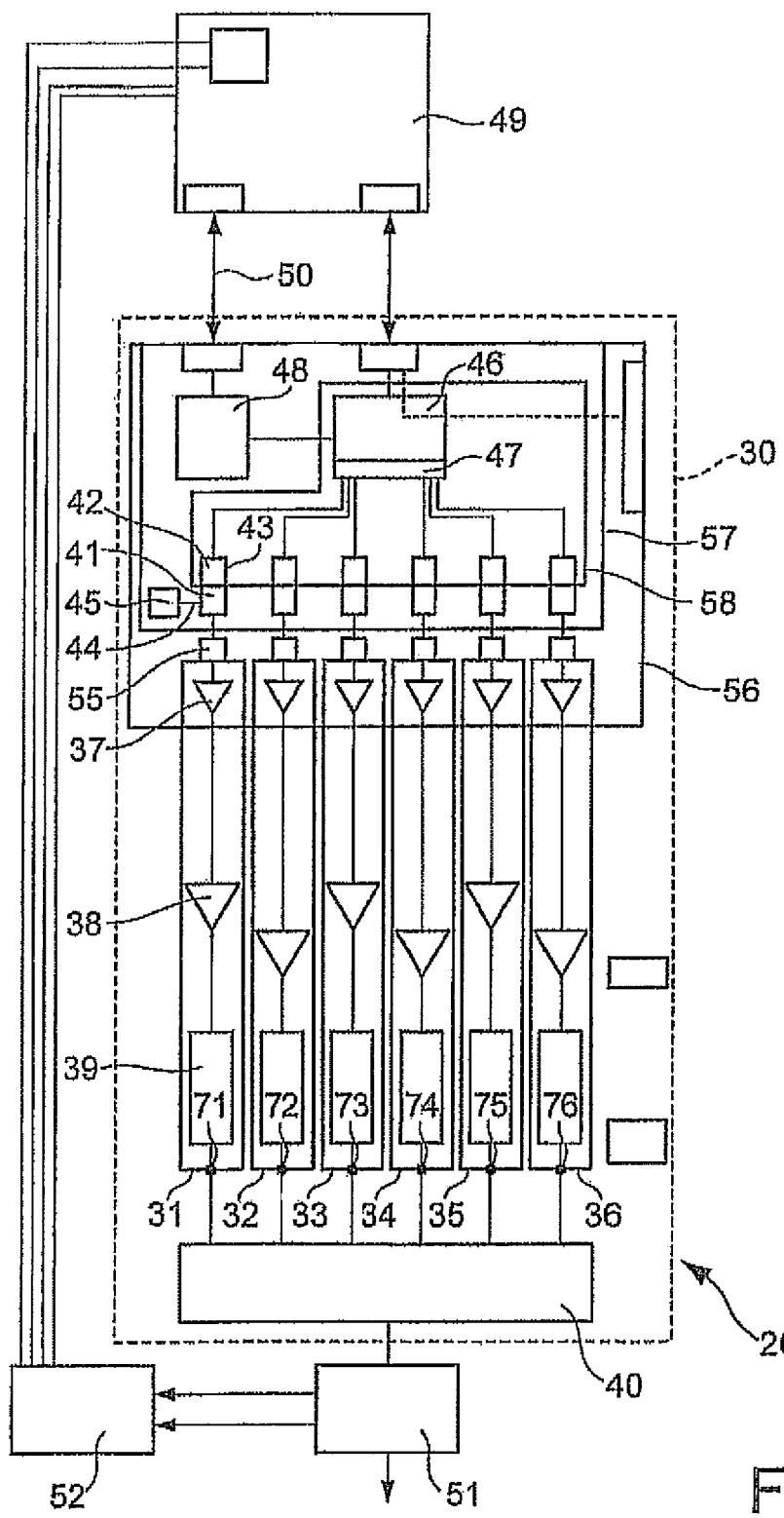
FIG. 2 is a block diagram of an example power supply system.

FIG. 2 shows a strongly schematic illustration of a power supply system 20. The power supply system 20 comprises a power converter 30 that generates an output power, which can be supplied to a load, for example a plasma process or a laser excitation. Several amplifier paths 31-36 are provided in the power converter 30. The amplifier paths 31-36 can be mostly constructed identically. For exemplary purpose, only the amplifier path 31 is described below. The amplifier paths 31-36 comprise several amplifiers 37, 38, suitable for amplifying an analogue signal. At the end of the amplifier paths 31-36, an amplifier 39 each with at least one LDMOS transistor is provided, whose output is connected directly or indirectly, for example via an impedance matching member and/or filter, to a combiner 40. All outputs of all amplifier paths 31-36 are in particular connected to the combiner 40, in particular in the same way. Individual power supplies from the amplifier paths 31-36 are coupled to a total power by the combiner 40.

The fact that the amplifier paths 31-36 are constructed mostly identically does not necessarily mean that they have the same amplification. Component diversity and tolerances during the construction of circuits can result in substantial differences in the phase and/or the amplitude of the high-frequency power signals generated on the amplifier paths 31-36, whilst the input signal is identical.

A DAC 41 with an allocated logic circuit unit 42 is installed upstream of each amplifier path 31-36. The DAC 41 is in particular supplied with a series of digital values from the logic circuit unit 42, from which the DAC 41 produces an analogue output signal, which is supplied to one of the amplifier paths 31-36 possibly after filtering with an optional filter 55. The DAC 41 and the logic circuit unit 42 can be integrated into a so-called direct digital synthesis component (DDS component) 43, also called: direct digital synthesizer. Each one of the amplifier paths 31-36 is allocated an own DDS component 43 and a corresponding DAC 41 as well as a logic circuit unit 42.

Figure 3:
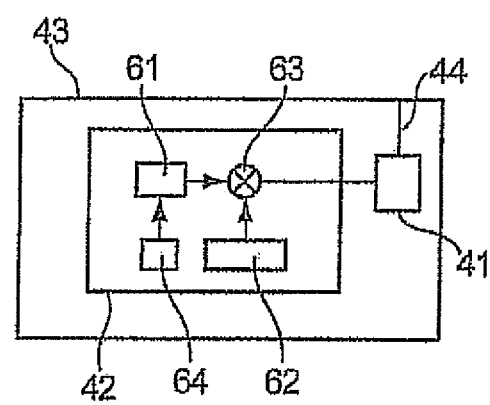
FIG. 3 is a block diagram of an example DDS component.

The DDS component 43 of FIG. 3 is described as an example. The logic circuit unit 42 in FIG. 3 comprises: a signal data memory 61, in which signal data values for generating the analogue signal form are stored, an amplitude data memory 62, in which amplitude data values for influencing the amplitudes of the analogue signals are stored, a multiplier 63 for the multiplication of signal data values with the amplitude data values, and a counter 64, which ensures that signal data values are read from the signal data memory 61 at predetermined intervals, and supplied to the multiplier. The signal data memory 61 as well as the amplitude data memory 62 can be designed as so-called look-up-tables (LUTs).

The DAC 41 further comprises a reference signal input 44, which can be downstream from a control circuit 45 in order to generate a reference signal. The control circuit 45 can be realized in the in the digital logic circuit yet to be described (programmable logic device, PLD) 46. The digital logic circuit 46 can be designed as a field programmable (logic) gate arrangement (Field Programmable Logic Gate Array, FPGA) The control circuit 45 can also be designed as an FPGA or be a component of an FPGA.

The reference signal entered at the reference signal input 44 can influence the output signal, namely the generated analogue signal of the DAC 41. The digital logic circuit 46, which in particular also comprises a memory 47 designed as a look-up-table (LUT), is located upstream from the DDS component 43. Amplitude data values that can be written in the amplitude data memory 62 by the memory 47 can be stored in the memory 47. Phase correction data can also be stored. Values stored in the memory 47 serve for compensating differences in the amplifier paths 31-36 or in downstream combiners 40. The values can be transferred to the logic circuit unit 42, in particular the amplitude data memory 62. The digital logic circuit 46 is controlled by a digital processor, in particular a digital signal processor (DSP) 48, connected with a system controller 49 via a data bus 50.

The digital processor, in particular the digital signal processor (DSP) 48, the memory 47 and the logic circuit units 42 can be realized in a logic component 58. The logic component 58 can be designed as a digital logic circuit PLD, in particular an FPGA. If the DAC 41 is also integrated this will result in a compact logic component 57. The digital processor, in particular a DSP, 48, the memory 47, the DDS components 48, the memory 47, the DDS components 43 and also the DACs 41, as well as the filters 55 and the first amplifiers 37 can be realized on a circuit board 56. The identical circuit board 56 can be used for a multitude of different power supply systems with different capacities, different frequencies and different supply loads (laser, plasma, etc.).

The output power of the combiner 40 is supplied to a load, for example a plasma process, via a directional coupler 51. The directional coupler 51 can record the power supplied and the power reflected by the load. Measurement signal processing is realized with a measuring device 52 connected with the directional coupler 51. The measuring device 52 in turn are connected with the system controller 49. It can therefore be determined by the system controller 49 with the aid of the recorded output power and the recorded reflected power which output power is to be produced by the combiner 40. The system controller 49 can control the DSP 48, and the DSP 48 in turn the FPGA 46, according to this stipulation.

Arc detection can be realized in the measuring device 52. In order to ensure a fast reaction to an arc the arc detection, i.e., the measuring device 52, can be connected directly with the DAC 41, in particular its reference signal input 44, or the control circuit 45.

Digital values including amplitude information as well as phase, and possibly also frequency information, are stored in the memories 47, so that an analogue signal with a predetermined amplitude, frequency and phase position can be generated at the output of the DAC 41. In this way it is possible to match the output signals of individual amplifier paths 31-36 to each other, so that the same can be coupled in the combiner 40 for improved output power. Very simple combiners 40 can in particular be used in this way without loss inducing equalizing impedances, and power losses kept small. Generating an analogue signal in the way according to the invention makes it possible to influence and change the power at the output of the combiner 40 very quickly.

Figure 4:
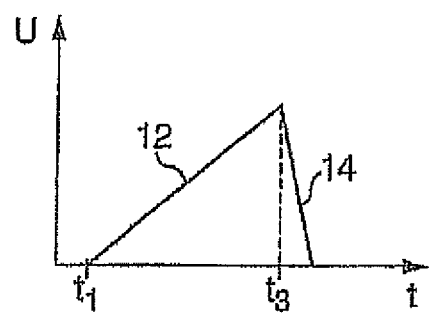
FIG. 4 is a diagram illustrating a curve of an example reference signal for detecting an arc.

The diagram of FIG. 4 shows a voltage that equals an input signal at the reference signal input of a DAC over time. At position t1, a flashover is detected. The voltage of the reference signal is then increased, which is indicated by reference number 12. In the case shown the voltage of the reference signal is ramped up. This results in the output signal of the DAC being reduced. Instead of ramping up the reference signal, the reference signal can also be increased in steps to a maximum value, which can result in the arc extinguishing power being also set in steps. At position t3, the extinguishing of the arc is identified. As a consequence the voltage of the reference signal is reduced, as indicated by reference number 14. The previously set output power of the DAC is therefore reinstated.

Figure 5:
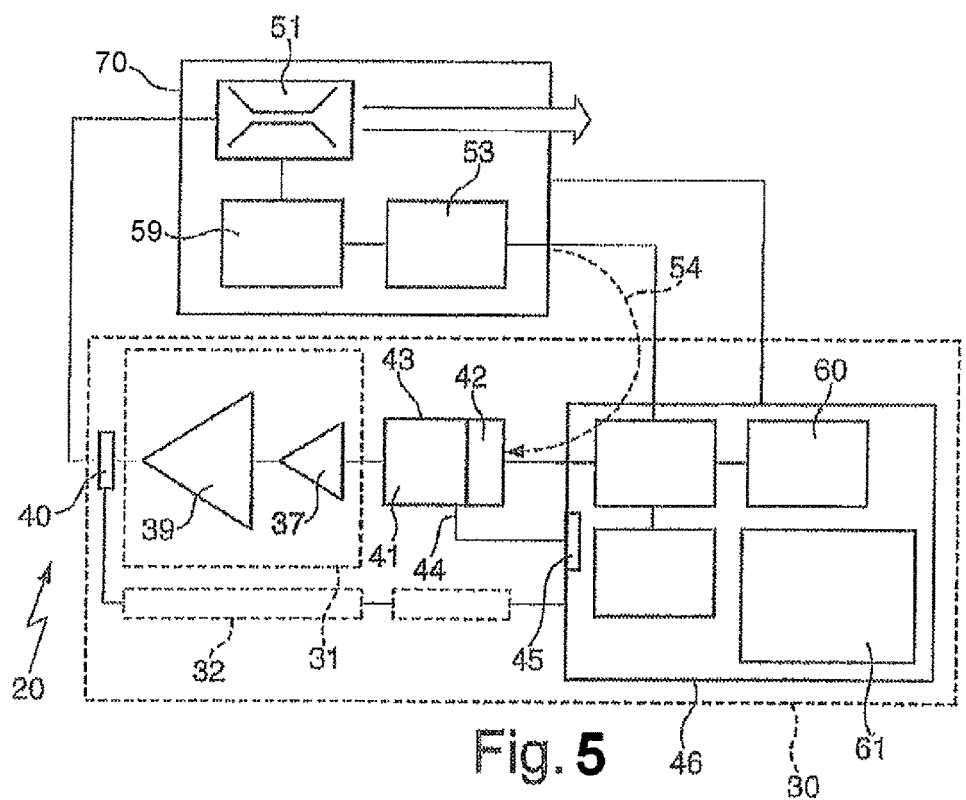
FIG. 5 is a block diagram of an example power supply system.

The power supply system 20 shown in the block diagram of FIG. 5 is a slightly modified illustration of the power supply system 20 from FIG. 2. Identical components have been allocated the same reference numbers. The power supply system 20 of FIG. 5 comprises a power converter 30 generating an output power, which can be supplied to a load, for example a plasma process or laser excitation. Several amplifier paths 31, 32 are provided in the power converter 30. For illustration only, only two amplifier paths are shown here, and the amplifier path 32 can be constructed mostly identically to amplifier path 31.

The output power of combiner 40 is supplied to a load, for example a plasma process, via a measuring device 70 comprising a directional coupler 51. The directional coupler 51 can record the power output and power reflected by the load. As an alternative to the directional coupler, or in addition, other decoupling means can be used, for example a transmission means for measuring current and/or a voltage separator for measuring voltage.

The measuring device 70, which can be considered an arc detection, further comprises an ADC 59. The directional coupler 51 and the ADC 59 can be located on the same circuit board for this. The directional coupler 51 can be designed as a planar construction. The measuring device 70 further comprises a logic circuit 53 for generating an arc detection signal supplied directly to the DDS 43. This direct supply is indicated by the arrow 54. It indicates in particular that the cable for the arc detection signal can be looped through the digital logic circuit 46. The line indicated by reference number 54 can be understood as a specific line, via which a signal can be supplied to the DAC 41 particularly quickly. The logic circuit 53, the directional coupler 51 and the ADC 59 can be realized on one circuit board. The ADC 59 and the logic circuit 53 can be realized in one component.

In some implementations, an arc management circuit 60 which is positioned in the digital logic circuit 46 is also provided. The arc management circuit 60 can be designed as FPGA. As it is positioned in the logic circuit 46 the arc management circuit 60 is also connected with the DDS 43 or the DAC 41. The arc management circuit 60 can, as is shown here, be connected with the logic circuit unit 42. Alternatively the DAC 41 can comprise a digital signal input in addition to the reference signal input, which is connected with the digital logic circuit 46, in particular the arc management circuit 60. The digital logic circuit 46 can comprise further logic operators, which is indicated by reference number 61.

The preparation of the arc detection signal takes place directly in the measuring device 70 without the participation of further logic components of the digital logic circuit 46 in the generation of the arc detection signal. A single signal thus suffices to inform the system about the existence of an arc. The direct connection of the arc detection signal with the DAC 41 means that the arc can practically be recognized without delay. This "ultra fact arc handling routine" can be supplemented with additional logic, for example the arc management circuit 60, which can implement higher ranking decision and react substantially slower.

A number of embodiments of the invention have been described. Nevertheless, it will be understood that various modifications may be made without departing from the spirit and scope of the invention. Accordingly, other embodiments are within the scope of the following claims.

What is claimed is:

1. A power supply system comprising:
a digital-to-analogue converter (DAC) configured to generate an analogue signal; and
an amplifier path on which the analogue signal is amplified to generate a high-frequency power signal to be provided to a plasma chamber for supplying a plasma process with high-frequency power,
wherein the DAC is configured to
be connected to an arc detection device that is configured to monitor the plasma chamber for arcs and
be controlled by the arc detection device to modify the analogue signal in response to detecting an occurrence of an arc.

2. The power supply system of claim 1, comprising a measuring device including the arc detection device,
wherein the measuring device comprises:
an analogue-to-digital converter (ADC); and
a logic circuit configured to generate an arc detection signal in response to detecting the occurrence of an arc.

3. The power supply system of claim 2, wherein the arc detection device is configured to monitor the plasma system for arcs by recording a signal associated with at least one of: a first power supplied to the plasma, a second power reflected by the plasma, a current flowing into the plasma, and a voltage applied to the plasma.

4. The power supply system of claim 3, wherein the ADC is configured to convert the recorded signal into digitized values, and
wherein the logic circuit is configured to:
receive the digitized values supplied by the ADC,
evaluate the digitized values, and
generate the arc detection signal based on a result of the evaluation.

5. The power supply system of claim 4, wherein the ADC is configured to sample the recorded signal with a frequency of more than 1 MHz, and
wherein the logic circuit is configured to be clocked with a clock signal with a frequency of more than 1 MHz.

6. The power supply system of claim 4, wherein the ADC and the logic circuit are configured to be clocked with a same clock signal.

7. The power supply system of claim 1, further comprising an arc management circuit connected to the DAC,
wherein the arc detection device is configured to control the DAC by controlling the arc management circuit that is configured to control the DAC.

8. The power supply system of claim 7, wherein the arc management circuit is configured to:
receive a signal from the arc detection device when an arc is identified; and
control the DAC depending on a determination of whether the arc has been extinguished or not.

9. The power supply system of claim 7, wherein the DAC comprises a digital signal input and a reference signal input, and
wherein the arc management circuit is configured to:
generate, dependent on an arc detection signal recorded by the arc detection device, at least one input signal to be output to the digital signal input of the DAC; and
change a reference signal supplied to the reference signal input of the DAC.

10. The power supply system of claim 1, wherein the arc detection device is configured to control one or more DACs in response to detecting the occurrence of an arc.

11. The power supply system of claim 1, wherein the high-frequency power signal has a frequency of more than 1 MHz, and
wherein the DAC is controllable to generate the analogue signal with the same frequency as the high-frequency power signal.

12. The power supply system of claim 1, configured to supply the plasma chamber with an arc extinguishing power during an extinguishing operation, the arc extinguishing power being smaller than a plasma operating power during a plasma operation,
wherein the plasma operating power and the arc extinguishing power are generated at least in part by:
controlling the DAC based on monitoring the plasma system for arcs; and
amplifying the analogue signal of the DAC on the amplifier path to provide at least a part of the plasma operating power or the arc extinguishing power.

13. The power supply system of claim 1, further comprising:
one or more additional DACs configured to be controlled based on monitoring the plasma system for arcs; and
one or more respective subsequent amplifier paths for the one or more additional DACs configured to amplify respective analogue signals of the one or more additional DACs to have at least a part of the plasma operating power or the arc extinguishing power.

14. The power supply system of claim 13, wherein the analogue signals of at least two of the DACs are differently amplified on the respective amplifier paths or amplified with different cycle times.

15. The power supply system of claim 1, comprising a direct digital synthesizer including the DAC and a logic circuit,
wherein the logic circuit comprises:
a digital data memory configured to store a plurality of signal data values;
an amplitude data memory configured to store a plurality of amplitude data values, and
a multiplier configured to generate a digital signal by multiplying a signal data value stored in the digital data memory and an amplitude data value stored in the amplitude data memory, and
wherein the DAC is configured to generate the analogue signal from the digital signal.

16. The power supply system of claim 15, wherein the direct digital synthesizer is configured to:
change the amplitude data values stored in the amplitude data memory to switch from generating a plasma operating power for a plasma operation to generating an arc extinguishing power for an arc extinguishing operation.

17. The power supply system of claim 16, wherein the DAC is supplied with a same series of digital values during the plasma operation and during the arc extinguishing operation.

18. The power supply system of claim 1, wherein the DAC is configured to generate a different analogue signal during an arc extinguishing operation than during a plasma operation.

19. The power supply system of claim 18, further comprising a controller configured to generate a reference signal to the DAC,
wherein the DAC is configured to generate the analogue signal based on an influence of the reference signal, and
wherein the reference signal is different during the plasma operation than during the arc extinguishing operation.

20. The power supply system of claim 19, wherein the controller is configured to, in response to detecting the occurrence of an arc, control a voltage of the reference signal in one of a stepped way and a ramped way, such that a voltage of the analogue signal is decreased and a plasma operation power for the plasma operation is reduced to an arc extinguishing power in the one of the stepped way and the ramped way.

* * * * *